(12) United States Patent
Kurimoto et al.

(10) Patent No.: US 10,447,223 B2
(45) Date of Patent: Oct. 15, 2019

(54) GAIN CONTROL AMPLIFICATION DEVICE

(71) Applicant: Mitsubishi Electric Corporation, Tokyo (JP)

(72) Inventors: Masanori Kurimoto, Tokyo (JP); Yuki Iwagami, Tokyo (JP); Masamitsu Uchiyama, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/834,199

(22) Filed: Dec. 7, 2017

(65) Prior Publication Data

US 2018/0358944 A1    Dec. 13, 2018

(30) Foreign Application Priority Data

Jun. 8, 2017    (JP) .................. 2017-113140

(51) Int. Cl.
*H03F 3/45*     (2006.01)
*H03G 3/30*     (2006.01)
*H03G 1/00*     (2006.01)

(52) U.S. Cl.
CPC ........... *H03G 3/30* (2013.01); *H03F 3/45475* (2013.01); *H03G 1/0088* (2013.01);
(Continued)

(58) Field of Classification Search
CPC ...... H03F 3/72; H03F 1/0277; H03F 3/45475; H03F 3/45183; H03F 3/217;
(Continued)

(56) References Cited

U.S. PATENT DOCUMENTS 5,703,518 A * 12/1997 Yamamoto ............ G01R 19/22
                                                    307/127
6,806,766 B2 * 10/2004 Hasegawa ................ H03F 1/52
                                                    330/51

(Continued)

FOREIGN PATENT DOCUMENTS

JP    2002352348 A    12/2002
JP    2007-088845 A    4/2007
(Continued)

OTHER PUBLICATIONS

Communication dated May 29, 2018 from the Japanese Patent Office in counterpart Japanese application No. 2017113140.

*Primary Examiner* — Khanh V Nguyen
(74) *Attorney, Agent, or Firm* — Sughrue Mion, PLLC; Richard C. Turner

(57) ABSTRACT

Provided is a gain control amplification device having a wide range and high accuracy and configured to adapt measurement target current to the input range of an A/D converter. The gain control amplification device includes: a plurality of differential amplifiers having different gains with respect to measurement target current or voltage; a threshold control circuit for comparing output of the differential amplifier with threshold voltage; a switch for selecting output of one of the plurality of differential amplifiers on the basis of output of the threshold control circuit; and an offset control circuit OF and an addition circuit for adding offset voltage to output of one of the differential amplifiers.

4 Claims, 3 Drawing Sheets

(52) U.S. Cl.
CPC ............... *H03F 3/45183* (2013.01); *H03F 2203/45138* (2013.01); *H03F 2203/45528* (2013.01); *H03F 2203/45594* (2013.01); *H03G 1/0023* (2013.01)

(58) Field of Classification Search
CPC ............ H03F 3/2173; H03F 3/2171; H03F 2203/45138; H03F 3/45479; H03G 1/0088; H03G 3/30; H03G 1/0023
USPC .................................. 330/51, 69, 251, 254
See application file for complete search history.

(56) References Cited

U.S. PATENT DOCUMENTS

| | | | |
|---|---|---|---|
| 9,993,386 B2 * | 6/2018 | Racette | H03F 3/211 |
| 2005/0151587 A1 * | 7/2005 | Ozasa | H03F 3/211 |
| | | | 330/253 |

FOREIGN PATENT DOCUMENTS

| | | | |
|---|---|---|---|
| JP | 4800371 B2 | 10/2011 | |
| JP | 2013167546 A | 8/2013 | |

* cited by examiner

GAIN CONTROL AMPLIFICATION DEVICE

BACKGROUND OF THE INVENTION

1. Field of the Invention

The present invention relates to a gain control amplification device for controlling amplification so that current or voltage that is a measurement target is adapted to the input range of an A/D converter.

2. Description of the Background Art

In a measurement device for current or voltage, input voltage amplified by a certain gain is inputted to an A/D converter normally provided to a microcomputer, whereby the measurement target current or voltage is measured. For the A/D converter, the minimum input voltage and the maximum input voltage are prescribed, and by the number of bits thereof, accuracy of the measurement target is determined. The gain is determined so as to be adapted to the input voltage range of the A/D converter.

For example, as shown in FIG. 6, it is assumed that current flowing through a shunt resistor Rshunt is to be measured. In the case where the specifications of an A/D converter provided in a microcomputer prescribe an input voltage range of 0 V to 5 V and 10-bit accuracy (($(5-0)/(2^{10})$ =about 4.88 mV), the shunt resistor Rshunt is 1 mΩ, and the measurement target current is 0 to 5 A, a gain R2/R1 of a differential amplifier A1 may be set at 1000 in order to make the best of the range and accuracy of the A/D converter. The current detection accuracy at this time is about 4.88 mA.

However, the accuracy requirement for the measurement target voltage or current is not always the same in the measurement range. High accuracy may be required for part where voltage or current is small, whereas low accuracy may be permitted for part where voltage or current is great. For example, it is assumed that detection accuracy for a range from 0 [A] to 0.5 [A] is required to be 2 [mA] and detection accuracy for a range from 0.5 [A] to 5 [A] is only required to be 6 [mA].

In the above differential amplifier A1, when the required measurement accuracy is not always the same in the measurement range, if the setting is adapted to high accuracy requirement, the measurement range becomes insufficient, whereas if the setting is adapted to low accuracy requirement, detection accuracy for the lower range is not satisfied. In addition, if the above measurement circuit is to be switched by a switch or a relay, a calculation result derived from the current needs to be fed back for switch control, and therefore requirement in terms of response is not satisfied.

On the other hand, in the case where a detection signal is converted to an analog electric signal and the analog electric signal is inputted to the A/D converter, and the level of the detection signal is measured by the converted digital signal, the input range of the A/D converter might be exceeded depending on the magnitude of unnecessary DC offset voltage included in the analog electric signal. In order to eliminate such offset voltage, there is known an invention in which a detection signal is inputted to one of the input ends of a differential amplifier and offset elimination voltage is feedback-inputted to the other input end so that an offset of a signal on which an unnecessary DC component is superimposed is accurately eliminated (see Japanese Laid-Open Patent Publication No. 2007-88845, hereinafter, referred to as Patent Document 1).

In the case of measuring the magnitude of current or a physical quantity such as an electric amount or a power amount relevant to the current, an I/V conversion resistor is used for converting the current to voltage. Conventionally, the measurement is performed while switching (range switching) the I/V conversion resistor among several types of I/V conversion resistors having different resistance values in accordance with the magnitude of target current by using a switch, a relay, or a semiconductor switch.

In such a measurement method, in general, it is difficult to perform range switching for current that has a wide dynamic range and varies at high speed, and in the case where the measurement target current is small so that an influence of leakage current of a semiconductor switch becomes a factor for error, the measurement method is not practical.

Accordingly, in order to solve the above problem, the following invention is known. An operational amplifier for error amplification and an operational amplifier for I/V conversion using an I/V conversion resistor as a negative feedback resistor are provided, one terminal of a current-ON/OFF semiconductor switch is connected to the inverting input terminal of the operational amplifier for error amplification, and the other terminal is connected to the inverting input terminal of the operational amplifier for I/V conversion. The non-inverting input terminal of the operational amplifier for I/V conversion can be selectively connected to output of the operational amplifier for error amplification, or to the ground, by using a range-ON/OFF semiconductor switch, and both or one of the current-ON/OFF semiconductor switch and the range-ON/OFF semiconductor switch is turned on or off. Thus, a current/voltage conversion circuit is obtained in which measurement error due to leakage current of a semiconductor switch or bias current is less likely to occur (see Japanese Patent No. 4800371, hereinafter, referred to as Patent Document 2).

The invention of Patent Document 1 is configured to accurately eliminate an offset of a signal on which an unnecessary DC component is superimposed, but is not adaptable to a measurement target of which the measurement range is wide, and since the offset elimination voltage needs to be fed back, there is a problem with response.

The invention of Patent Document 2 is for obtaining a current/voltage conversion circuit in which measurement error due to leakage current of a semiconductor switch or bias current is less likely to occur, but is not configured to tune the measurement range and accuracy appropriately in accordance with requirement, and also, the circuit configuration is complicated.

SUMMARY OF THE INVENTION

The present invention has been made to solve the above problems and an object of the present invention is to provide a gain control amplification device capable of dynamically controlling the measurement range and accuracy appropriately in accordance with requirement.

A gain control amplification device according to the present invention includes: a plurality of differential amplifiers having different gains with respect to measurement target current or voltage; a threshold control circuit configured to compare output of any of the differential amplifiers with threshold voltage; a switch configured to select output of one of the plurality of differential amplifiers on the basis of output of the threshold control circuit; and an offset control circuit and an addition circuit configured to add offset voltage to output of one of the differential amplifiers.

According to the present invention, even if a measurement range of measurement target current or voltage is wide and high accuracy is required therefor, the measurement range and detection accuracy are appropriately tuned in accordance with requirement. Thus, it becomes possible to satisfy the accuracy requirement in real time without unnecessarily using an expensive A/D converter, narrowing the measurement range, or deteriorating response.

The foregoing and other objects, features, aspects and advantages of the present invention will become more apparent from the following detailed description when read in conjunction with the accompanying drawings.

DETAILED DESCRIPTION OF THE PREFERRED EMBODIMENTS OF THE INVENTION

First Embodiment

Hereinafter, a gain control amplification device according to embodiment 1 of the present invention will be described with reference to FIG. 1 to FIG. 5.

Figure 1:
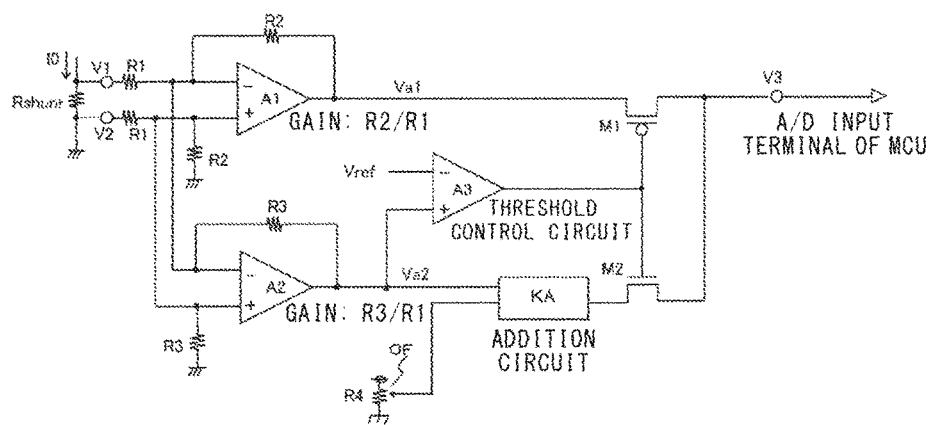
FIG. 1 is a diagram showing the configuration of a gain control amplification device according to embodiment 1 of the present invention.

FIG. 1 is a circuit configuration diagram of the gain control amplification device according to embodiment 1 of the present invention. The gain control amplification device includes: a shunt resistor Rshunt used for measurement of measurement target current I0; a plurality of differential amplifiers A1, A2 having different gains; input resistors R1 and feedback resistors R2, R3 for the differential amplifiers A1, A2; a PMOS switch M1; an NMOS switch M2; a threshold control circuit A3 configured to perform ON/OFF control of the MOS switches M1, M2 on the basis of comparison with threshold voltage Vref; an offset control circuit OF and an addition circuit KA for providing offset voltage to an output potential of the differential amplifier A2; and an output voltage terminal V3 serving as an interface to an A/D input of an microcomputer (MCU). Normally, the output voltage terminal V3 (voltage of the terminal is V3) is connected to an input terminal of an A/D converter of the MCU.

Here, the differential amplifier A1 is a high-accuracy amplifier realizing a high gain R2/R1, and the differential amplifier A2 is a low-accuracy amplifier realizing a low gain R3/R1. In addition, the threshold voltage Vref is a reference value for excluding measurement results that are outside the ranges of measurements performed with the respective differential amplifiers A1, A2, and is variably set as appropriate.

In the present invention, the differential amplifiers A1, A2 having a plurality of detection accuracies and a plurality of gains are prepared depending on the required detection accuracy. For example, if, as in the above example, the detection accuracy for a range from 0 [A] to 0.5 [A] is required to be 2 [mA] and the detection accuracy for a range from 0.5 [A] to 5 [A] is required to be 6 [mA], two differential amplifiers having these detection accuracies are prepared.

Figure 2:
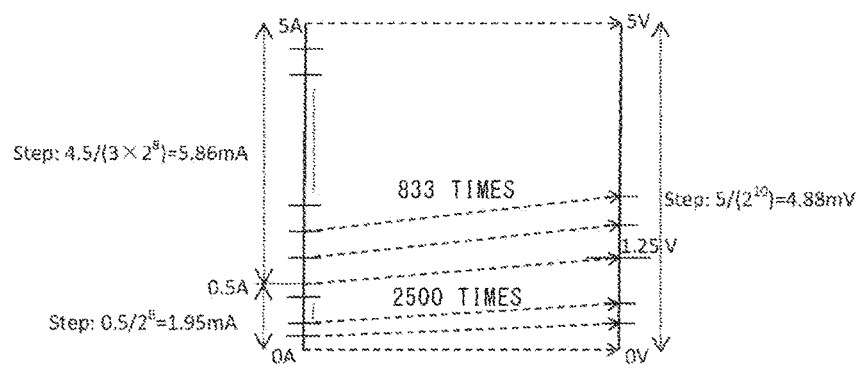
FIG. 2 is a diagram showing an amplification factor and an offset for realizing different required accuracies on the basis of the gain control amplification device according to embodiment 1 of the present invention.

As shown in FIG. 2, the input range of the A/D converter for measurement results in a current detection range from 0 [A] to 0.5 [A] is allocated to $2^8$ steps from 0 [V] to 1.25 [V], and the input range of the A/D converter for measurement results in a current detection range from 0.5 [A] to 5 [A] is allocated to $3 \times 2^8$ steps from 1.25 [V] to 5 [V], whereby input range allocation of 10 bits ($2^{10}$) is performed. Accordingly, the detection accuracy for the former detection range becomes about 1.95 [mA], and the detection accuracy for the latter detection range becomes about 5.86 [mA]. Thus, the detection accuracy requirement is satisfied. The amplification gains with respect to input current are 2500 times and 833 times, respectively.

Figure 3:
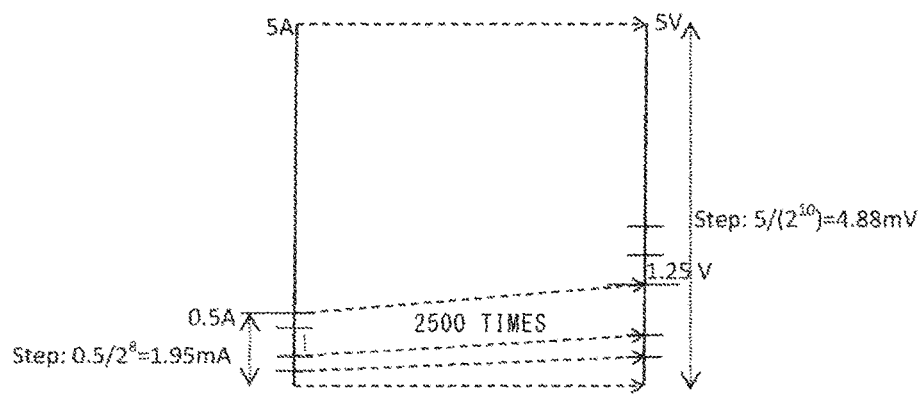
FIG. 3 is a diagram showing an amplification factor for high accuracy requirement.
Figure 4:
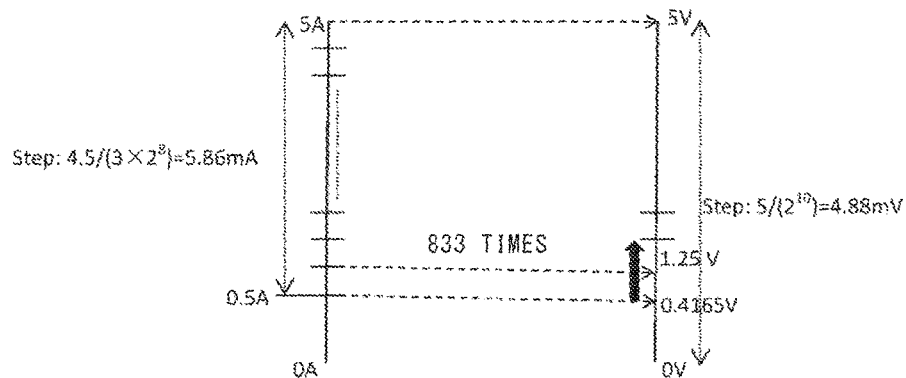
FIG. 4 is a diagram showing an amplification factor and an offset for low accuracy requirement.

Since the former current measurement range is from 0 [A] to 0.5 [A], as shown in FIG. 3, a value multiplied by 2500 is outputted and measurement results beyond 0.5 [A] are excluded. Since the latter current measurement range is from 0.5 [A] to 5 [A], as shown in FIG. 4, a value multiplied by 833 is outputted and measurement results equal to or smaller than 0.5 [A] are excluded, and in addition, the differential amplification voltage value corresponding to this current measurement result, i.e., about 0.4165 [V] needs to be corrected (offset) to 1.25 [V]. The reason why the offset is performed is to buffer a difference caused due to the different gains of both differential amplifiers when the output of the differential amplifier to be made effective is switched.

In order to exclude measurement results that are outside the range, as shown in FIG. 1, the threshold control circuit A3 for which here the threshold voltage Vref is set at about 0.4165 [V] is used. That is, when output Va2 of the differential amplifier A2 is smaller than the threshold voltage Vref, the PMOS switch M1 is turned on and the NMOS switch M2 is turned off, so that output Va1 of the differential amplifier A1 is outputted. On the other hand, when output Va2 of the differential amplifier A2 is equal to or greater than the threshold voltage Vref, the PMOS switch M1 is turned off and the NMOS switch M2 is turned on, so that output Va2 of the differential amplifier A2 is outputted. At this time, in order to shift 0.4165 [V] which is the value of output Va2 at 0.5 [A], to 1.25 V, the offset control circuit OF is used and the offset voltage value thereof is added to the measurement result by the addition circuit KA.

As described above, in the present invention, the voltage difference (V2−V1) between voltages applied to the terminal V1 and the terminal V2 via the shunt resistor Rshunt on the basis of the measurement target current I0 is converted to predetermined output voltage V3 while the differential amplifier to be used is dynamically switched between the differential amplifier A1 and the differential amplifier A2 depending on the measurement amount thereof, and then, on the basis of the voltage V3, determination for the measurement target current I0 is performed using the MCU.

That is, from the voltage value inputted via the A/D converter, the MCU normalizes the input voltage in accordance with the measurement accuracy thereof, in this example, at intervals of 4.88 m[V] because the range is from 0 [V] to 5 [V] and the number of steps is 10 bits, i.e., $2^{10}=1024$. Then, the original input current value is backwardly calculated using a conversion map stored in the MCU.

Example 1

Figure 5:
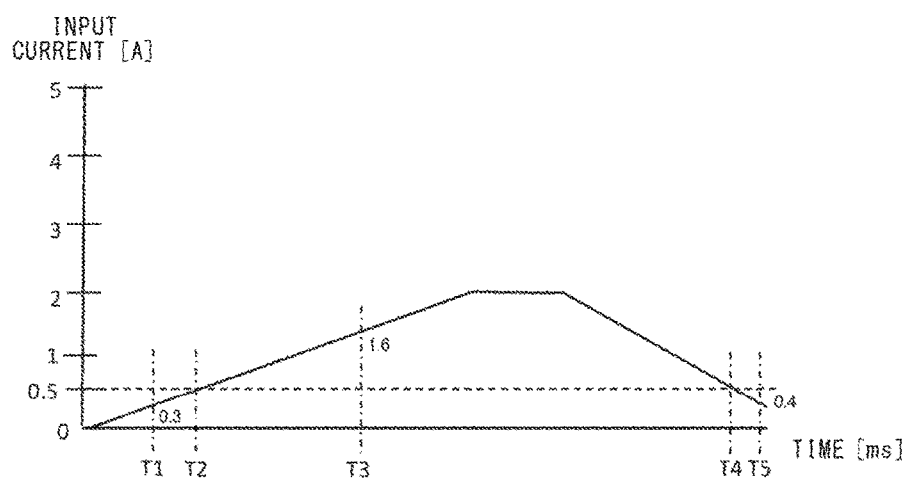
FIG. 5 is a graph showing an input example of measurement target current.
Figure 6:
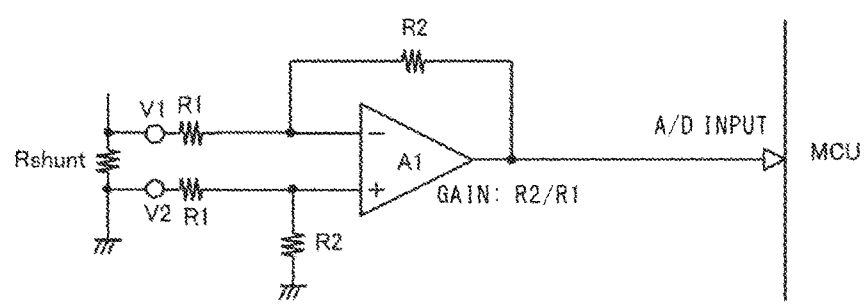
FIG. 6 is a diagram showing the configuration of a general differential amplification circuit.

In this example, an example in which input current shown in FIG. 5 is measured via the gain control amplification device of the present invention will be described. A target for which current is to be measured is a dynamically varying analog value of a camshaft position, a vehicle speed, a heater, or the like. The horizontal axis indicates a measurement time [ms] and the vertical axis indicates input current [A] at each measurement time.

In FIG. 5, input currents at respective times are as follows: 0.3 [A] at T1 [ms], 0.5 [A] at T2 [ms], 1.6 [A] at T3 [ms], 0.5 [A] at T4 [ms], and 0.4 [A] at T5 [ms]. As described above, the gains of the differential amplifier A1 and the differential amplifier A2 are 2500 times and 833 times, respectively, the shunt resistor Rshunt is 1 mΩ, the threshold voltage Vref is 0.4165 [V], and the offset voltage Voffset is (1.25−0.4165)=0.8335 [V]. Hereinafter, the circuit operation will be described in chronological order.

At time T1, V2−V1 is 0.3 [A]×0.001 [Ω]=0.3 [mV], and therefore Va1 and Va2 are 0.3×2500=0.75 [V] and 0.3×833=0.25 [V], respectively. Here, since Va2<Vref is satisfied, the PMOS switch M1 is turned on and the NMOS switch M2 is turned off. Thus, voltage 0.75 [V] of output Va1 of the differential amplifier A1 is directly outputted to the output voltage terminal V3 and is read into the A/D converter. As shown in FIG. 3 and FIG. 4, the MCU is provided with a table for backwardly converting the input voltage value read in the A/D converter to the original current value, whereby the original current value is calculated.

At time T2, V2−V1 is 0.5 [A]×0.001 [Ω]=0.5 [mV], and therefore Va1 and Va2 are 0.5×2500=1.25 [V] and 0.5×833=0.4165 [V], respectively. Here, since the value of Va2 is to exceed the threshold voltage Vref, the PMOS switch M1 is turned from on to off and the NMOS switch M2 is turned from off to on. Thus, the voltage value to be outputted to the output voltage terminal V3 is switched to a value obtained by adding an addition (offset) value by the addition circuit KA, in this example, 0.8335 [V], to output Va2 of the differential amplifier A2, i.e., 0.4165+0.8335=1.25 [V].

At time T3, V2−V1 is 1.6 [A]×0.001 [Ω]=1.6 [mV], and therefore Va1 and Va2 are 1.6×2500=4.000 [V] and 1.6×833=1.333 [V], respectively. Here, since Va2>Vref is satisfied, the PMOS switch M1 is turned off and the NMOS switch M2 is turned on. Thus, voltage 2.1665 [V] obtained by adding 0.8335 [V] to voltage 1.333 [V] of output Va2 of the differential amplifier A2 is outputted to the output voltage terminal V3 and is read into the A/D converter. As described above, the MCU calculates the original current value by using the table for backwardly converting the input voltage value read in the A/D converter.

At time T4, V2−V1 is 0.5 [A]×0.001 [Ω]=0.5 [mV], and therefore Va1 and Va2 are 0.5×2500=1.25 [V] and 0.5×833=0.4165 [V]. Here, since Va2 is to become smaller than the threshold voltage Vref, the PMOS switch M1 is turned from off to on and the NMOS switch M2 is turned from on to off. Thus, the voltage value to be outputted to the output voltage terminal V3, which has been the value obtained by adding the addition value by the addition circuit KA to output Va2 of the differential amplifier A2 until now, is switched to 1.25 [V] of output Va1 of the differential amplifier A1.

At time T5, V2−V1 is 0.4 [A]×0.001 [Ω]=0.4 [mV], and therefore Va1 and Va2 are 0.4×2500=1.000 [V] and 0.4×833=0.333 [V]. Here, since Va2<Vref is satisfied, the PMOS switch M1 is turned on and the NMOS switch M2 is turned off. Thus, the voltage 1.000 [V] of output Va1 of the differential amplifier A1 is directly outputted to the output voltage terminal V3 and is read into the A/D converter. As described above, the MCU calculates the original current value by using the table for backwardly converting the input voltage value read in the A/D converter.

Thus, a necessary gain and the offset voltage can be dynamically switched depending on the input current, whereby required current accuracy can be ensured. It is noted that, although the case where the measurement target is current has been described, the same applies to the case where the measurement target is voltage.

As described above, in the present invention, differential amplifiers having different detection accuracies and different gains are used, and the required accuracy switching threshold is calculated on the basis of the stored number of bits and the input voltage standard of the A/D converter serving as an output interface. In order that the input range of the A/D converter is matched with output voltage of each amplifier, the high-accuracy amplifier and the low-accuracy amplifier are allocated and the gain of each amplifier is set. The output of the amplifier to be made effective is switched by the threshold control circuit using a set switching point as a threshold. In order to buffer a difference caused due to the different gains of both amplifiers, the offset control circuit is used and the offset voltage value given by the offset control circuit is added to a measurement result by the addition circuit.

In this way, even if the measurement range is wide and high accuracy is required, it becomes possible to dynamically control the measurement accuracy automatically on the basis of the measurement value of current or voltage.

While the embodiments of the present invention have been described above, the present invention is not limited to the above embodiment, but various design modifications can be made. Accordingly, within the scope of the present invention, the above embodiment may be modified or simplified as appropriate.

Various modifications and alterations of this invention will be apparent to those skilled in the art without departing from the scope and spirit of this invention, and it should be understood that this is not limited to the illustrative embodiments set forth herein.

What is claimed is:

1. A gain control amplification device comprising:
   a plurality of differential amplifiers having different gains with respect to measurement target current or voltage;
   a threshold control circuit configured to compare output of any of the differential amplifiers with threshold voltage;
   a switch configured to select output of one of the plurality of differential amplifiers on the basis of output of the threshold control circuit; and
   an offset control circuit and an addition circuit configured to add offset voltage to output of one of the differential amplifiers.

2. The gain control amplification device according to claim 1, wherein
   for the plurality of differential amplifiers, a high-accuracy amplifier and a low-accuracy amplifier are allocated, and the threshold control circuit compares output voltage of the low-accuracy amplifier with the threshold voltage, and if the output voltage is smaller than the threshold voltage, the switch selects output of the high-accuracy amplifier.

3. The gain control amplification device according to claim 1, wherein for the plurality of differential amplifiers, a high-accuracy amplifier and a low-accuracy amplifier are allocated, and the threshold control circuit compares output voltage of the low-accuracy amplifier with the threshold voltage, and if the output voltage is greater than the threshold voltage, the switch selects output of the low-accuracy amplifier, and the offset control circuit and the addition circuit add the offset voltage to the output of the low-accuracy amplifier.

4. The gain control amplification device according to claim 2, wherein if the output voltage is greater than the threshold voltage, the switch selects output of the low-accuracy amplifier, and the offset control circuit and the addition circuit add the offset voltage to the output of the low-accuracy amplifier.

* * * * *